United States Patent
Lee et al.

[19]

[11] Patent Number: 6,136,687
[45] Date of Patent: Oct. 24, 2000

[54] METHOD OF FORMING AIR GAPS FOR REDUCING INTERCONNECT CAPACITANCE

[75] Inventors: Shih-Ked Lee; Chu-Tsao Yen, both of Fremont, Calif.; Cheng-Chen Calvin Hsueh, Taipei, Taiwan; James R. Shih, Cupertino; Chuen-Der Lien, Los Altos Hills, both of Calif.

[73] Assignee: Integrated Device Technology, Inc., Santa Clara, Calif.

[21] Appl. No.: 08/978,967

[22] Filed: Nov. 26, 1997

[51] Int. Cl.$^7$ .................................................. H01L 21/4763
[52] U.S. Cl. ......................... 438/624; 438/619; 438/421; 438/669
[58] Field of Search ...................... 438/597, 619, 438/623, 624, 633, 669, 421, 422

[56] References Cited

U.S. PATENT DOCUMENTS

| | | | |
|---|---|---|---|
| 4,502,210 | 3/1985 | Okumura et al. | 29/591 |
| 4,801,560 | 1/1989 | Wood et al. | 437/195 |
| 4,986,878 | 1/1991 | Malazgirt et al. | 156/643 |
| 5,119,164 | 6/1992 | Sliwa, Jr. et al. | 357/54 |
| 5,217,926 | 6/1993 | Langley | 437/228 |
| 5,278,103 | 1/1994 | Mallon et al. | 437/240 |
| 5,310,700 | 5/1994 | Lien et al. | 437/195 |
| 5,407,860 | 4/1995 | Stoltz et al. | 437/180 |
| 5,461,003 | 10/1995 | Havemann et al. | . |
| 5,559,055 | 9/1996 | Chang et al. | . |
| 5,641,712 | 6/1997 | Grivna et al. | 438/624 |
| 5,668,398 | 9/1997 | Havemann | 257/522 |
| 5,716,888 | 2/1998 | Lur et al. | 438/619 |
| 5,789,314 | 8/1998 | Yen | 438/622 |
| 5,960,311 | 9/1999 | Singh et al. | 438/623 |

FOREIGN PATENT DOCUMENTS

| | | |
|---|---|---|
| 1-189939 | 7/1989 | Japan . |
| 1-318248 | 12/1989 | Japan . |

OTHER PUBLICATIONS

Fleming, J. et al., "Use of Air Gap Structures to Lower Intralevel Capacitance" DUMIC Conference (1997).

*Primary Examiner*—Caridad Everhart
*Attorney, Agent, or Firm*—Skjerven Morrill MacPherson Franklin & Friel

[57] ABSTRACT

A method for manufacturing integrated circuits increases the aspect ratio of the electrical conductor members connected to the circuits by increasing the effective height of the conductors, either by forming a thicker layer of conductor material prior to patterning the conductor members, or by adding a capping dielectric layer to the conductor material prior to patterning, or by overetching the dielectric material underlying the conductor members.

The structure is then covered by a dielectric layer having poor step coverage, resulting in a number of voids and open spaces in the dielectric layer to thereby reduce the dielectric constant between the patterned conductors. A plasma etch-back of the dielectric layer is employed to open and shape additional voids and open spaces in the dielectric layer. This is followed by the deposition of a second layer of dielectric material to seal the structure, including any open spaces in the first layer of dielectric material.

14 Claims, 3 Drawing Sheets

METHOD OF FORMING AIR GAPS FOR REDUCING INTERCONNECT CAPACITANCE

BACKGROUND OF THE INVENTION

1. Field of the Invention

The present invention relates to integrated circuit manufacturing, and relates particularly to structures and methods for reducing the capacitance of conductor members in integrated circuits to produce an increase in switching speed and a reduction in cross-talk between the conductor members.

2. Description of the Prior Art

The continuing increases in component density and switching speed in current integrated circuits leads to a continuing need for improvements in process developments and structures utilized in the manufacture of these circuits.

As is well known, the response speed of an integrated circuit is determined by its time constant RC, where R is the resistance of the conductors in the circuit and C is the distributed capacitance between the conductors. The resistance R is determined by the resistivity of the conductors and can be decreased by increasing the physical size of the conductors. However, with the continuing emphasis on increasing miniaturization of integrated circuit components, there is a practical limit to the increases in the physical size of the conductors which can be employed and still remain commercially attractive.

The distributed capacitance between conductors is a function of the dielectric constant of the medium between the conductors. The dielectric constant of a vacuum is 1.0 and that of air is near 1.0, while the dielectric constant of silicon dioxide, a material which is commonly deposited between conductors in current integrated circuit manufacturing, is near 3.9. This relatively high dielectric constant for silicon dioxide and similar materials used for that purpose results in an undesirably high value of capacitance between the conductors, with a consequent increase in the circuit time constant and response time.

The following references discuss approaches which have been proposed in the prior art to reduce the dielectric constant between conductors in integrated circuit structures in order to increase the response speed.

U.S. Pat. No. 5,310,700, Lien et al, describes a fabrication technique for reducing the capacitance between spaced conductor members in a semiconductor structure by utilizing chemical vapor deposition (CVD) of an oxide film to create voids or air gaps between the conductor members in the oxide film surrounding the conductor members. In one embodiment, layers of insulating or conductive material are formed on top of the conductor members and extend over the edges of the conductor members to facilitate the formation of the air gaps therebetween during subsequent etching of the deposited oxide film.

A publication entitled *Use of Air Gap Structures To Lower Intralevel Capacitance,* Fleming et al, DUMIC Conference, February 1997, page 139, describes a process which creates low dielectric air gaps between conductors by first coating the structure using a CVD process with silicon dioxide having poor step coverage. The open areas and reentrant features in the structure resulting from this step are then filled with a material having a lower dielectric constant than silicon dioxide, such as hydrogen silsesquioxane (HSQ). However, this process does not provide for changing the shape or location of the air gaps after their initial formation, and the air gap formation provided thereby is determined solely by the step coverage of the CVD oxide and the metal spacings. In addition, the use of SOG in that reference increases the process complexity and may result in some process integration difficulties.

U.S. Pat. No. 5,278,103, Mallon et al, describes a method for producing controllable voids in doped glass dielectric films between conductors by flowing a layer of doped glass having voids therein to a thickness having a predetermined ratio with the size of the spacing between the conductors. This doped glass layer is reflowed to smooth the surface thereof without removing the desired voids therein. One or more additional doped glass layers may be applied to achieve the desired glass thickness. However, this technique can be applied only to conductors which can withstand the reflow temperature of doped glass, and is not applicable to metal layers with melting points lower than the reflow temperature of doped glass, such as aluminum alloys.

SUMMARY OF THE PRESENT INVENTION

The present invention provides methods for the controlled formation of air gaps between conductor members which take full advantage of the low dielectric constant properties of an air gap. The method is utilized both to maximize the volume of air gaps formed between the conductor members and to adjust the location of such air gaps.

The volume between conductor members available for the formation of air gaps is controlled in the present invention by increasing the aspect ratio of the conductor members (i.e., the ratio of their height vertical thickness to their width) either:

(a) by increasing the thickness of the conductor members, within the limits of the allowable manufacturing constraints, or (b) by applying a dielectric capping layer on the conductor material prior to patterning the conductor members in the conductor material to increase the effective thickness of the conductor members as it affects the aspect ratio, or (c) by overetching the dielectric layer underlying the conductor members during patterning to increase the aspect ratio of the conductors, or by a combination of the above steps.

After patterning the conductor members, (and the dielectric capping layer if employed), a conformal coating giving good conformation, such as tetraethylorthosilicate (TEOS), may be employed over the conductor members. Following this, a dielectric film with poor step coverage is deposited on the structure, thereby forming a number of air gaps and voids between the conductor members. A plasma etchback of the dielectric film is then performed to open up some gaps and remove portions of the dielectric film between conductors. Following this, a second layer of dielectric film is deposited to seal the air gaps and open spaces between the conductors.

DESCRIPTION OF THE PREFERRED EMBODIMENT

Figure 1A:
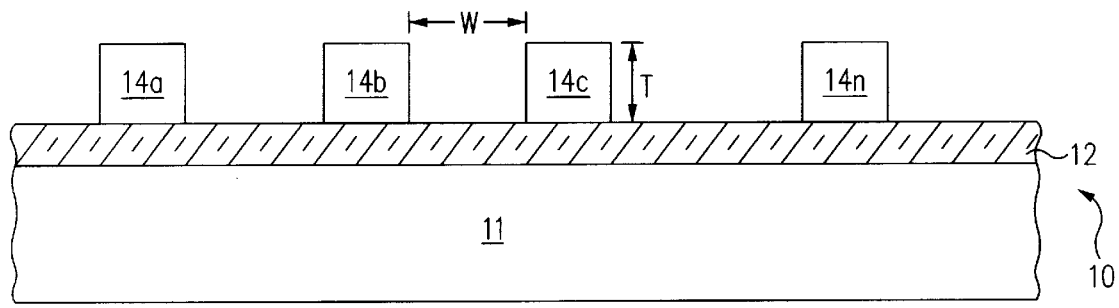
FIG. 1A is a cross-sectional view of an integrated circuit device in which the thickness of the conductor members is increased to increase their aspect ratio.

FIG. 1A illustrates one phase of the present invention directed to increasing the aspect ratio of the conductor member by increasing the thickness of the conductor members in order to increase the volume of material between them. In FIG. 1A, reference numeral 10 designates an integrated circuit structure including a semiconductor substrate 11 containing a plurality of integrated circuit elements therein. In an initial stage in fabrication, an insulating dielectric layer 12 is deposited on substrate 11, followed by an electrically conductive layer, such as aluminum alloy, a doped polysilicon material or other suitable electrically conductive material. This conductive layer may be etched to form separate conductor members 14a, 14b, 14c, . . . , 14n. The thickness or height of conductor members 14a–14n is represented by T, and the distance or width between conductor members by W.

As is known in the art, the aspect ratio of conductor members 14a–14n is represented by the ratio T/W and is a measure of the volume between conductor members. The thickness of the conductor members in prior art structures varies in dependence on the location of the members within the structure. Lower or intermediate conductor members within prior art structures typically have a thickness of 0.4–0.6 microns, while the upper or top layer of conductor members have a typical thickness of 0.8 micron or more. This variation in thickness results from the fact that the top conductor members carry higher current densities than the intermediate and lower conductor members, and the larger photoresist thickness required to etch these thicker members results in less conductor density in the top conductor members than in the intermediate and lower conductor members. With respect to the width between conductor members, prior art structures have employed a spacing of about 0.5 microns or more between the top conductor members, with a spacing of 0.2 microns or more between the intermediate and lower layers of conductor members.

In accordance with one aspect of this invention, the thickness of the bottom and intermediate conductor members is increased in order to increase the aspect ratio of the members. The allowable increase in conductor member thickness is determined primarily by the ability to etch them, since if the conductor members are too thick they will be difficult or impossible to etch properly. However, it is possible to increase the thickness of the conductive portion of these bottom and intermediate conductor members up to about 0.8 microns while maintaining the width or spacing between the conductor members at 0.2 microns or more, thereby representing a substantial increase in the aspect ratio of these conductor members. With respect to the conductor members in the top layer, current practice is to fabricate these to a thickness of 0.8 microns or more, and the present invention increases this thickness to 1.0 microns or more while maintaining the spacing between conductors at 0.5 microns or more.

Figure 1B:
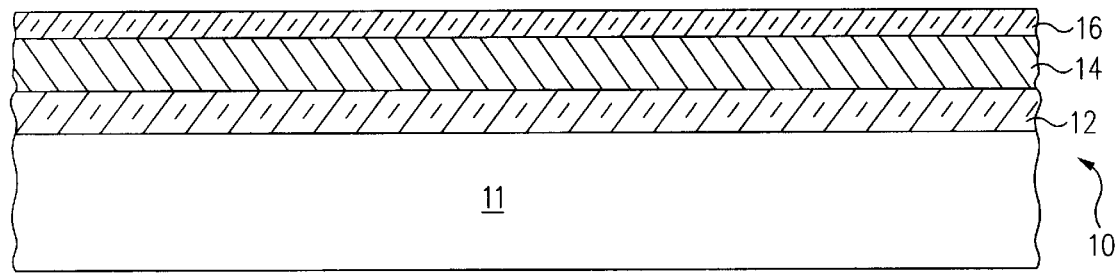
FIGS. 1B and 1C are cross-sectional views showing the use of a dielectric capping layer on the conductor members to increase their aspect ratio.
Figure 1C:
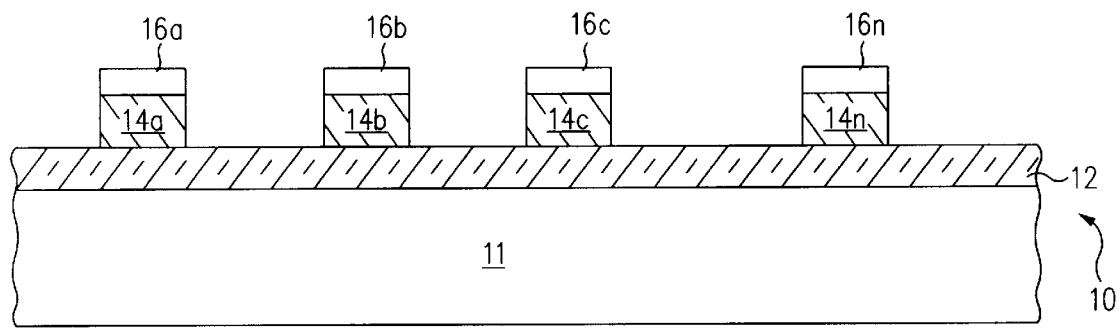

An alternate method of increasing the aspect ratio of the conductor members to increase the available volume of material between them is shown in FIGS. 1B and 1C. In FIG. 1B, substrate 11 has applied thereto dielectric insulating layer 12 and an electrically conductive layer 14 as before. Following this, a dielectric capping layer 16 such as silicon dioxide or silicon nitride is deposited on layer 14 as a step in increasing the aspect ratio of the conductors. Dielectric capping layer 16 may be deposited by conventional CVD techniques. A layer of photoresist material (not shown) may then be applied to dielectric capping layer 16, and etching is performed around the photoresist layer to produce a pattern of spaced conductor members 14a–14n, each of which is covered by an overlaying dielectric capping member 16a–16n as shown in FIG. 1C.

In general, it is less difficult to etch a combined structure of conductive layer 14 and dielectric capping layer 16 than to etch the same thickness of an all-metal layer. This is because the selectivity of an oxide etch or nitride etch to photoresist is much higher than the selectivity of a metal etch to photoresist. Preferably this etching is done in two steps, with an etch of dielectric capping layer 16 first, followed by an etch of conductive layer 14. The thickness of conductor members 14a–14n may be the same as the thickness of conventional conductor members, while dielectric capping members 16a–16n preferably have a thickness range of from 0.05 to 0.3 microns.

Thus, the embodiment of FIGS. 1B and 1C represent an alternative method of increasing the aspect ratio of the conductor members to thereby increase the volume between them.

Figure 1D:
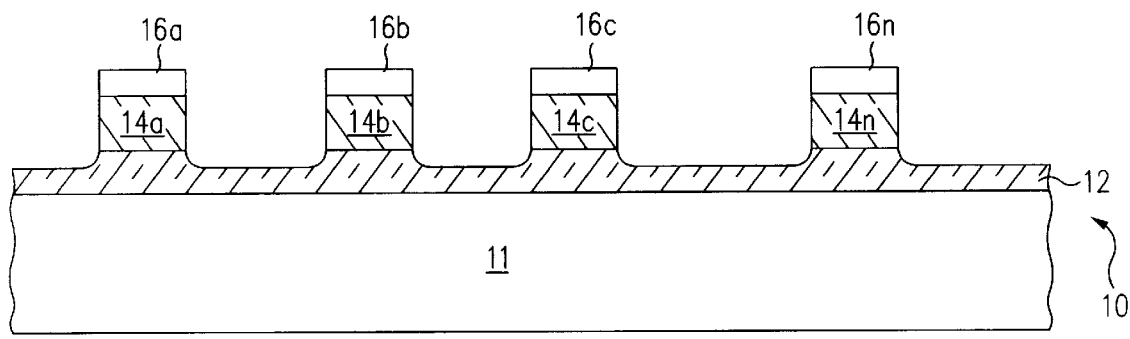
FIG. 1D is a cross-sectional view illustrating the overetching of the dielectric layer underlying the conductor members to increase their aspect ratio.

A further technique for increasing the aspect ratio of the conductor members is illustrated in FIG. 1D, in which dielectric layer 12 is overetched relative to conventional etching. In conventional fabrication techniques, dielectric layer 12 is somewhat overetched in order to prevent electric shorting between adjacent conductor members, but in the embodiment of FIG. 1D dielectric layer 12 is etched to a greater depth, preferably by extending the etching time. The etching technique employed may be the same as that utilized to etch conductor members 14a–14n, such as reactive ion etching or high density plasma etching, or may be a different etch method. Conventional etching may extend to a depth of 0.05 to 0.15 microns into the dielectric layer, while the overetching technique of the present invention preferably extends a distance of up to 0.3 microns.

Figure 1E:
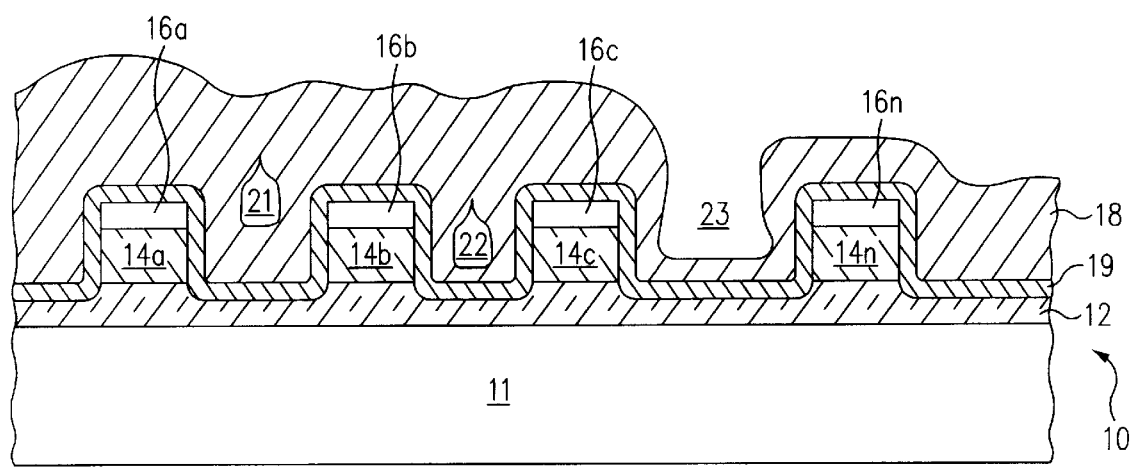
FIG. 1E illustrates the result of the application of a layer of dielectric material of poor step coverage to the structure of FIG. 1D.
Figure 1F:
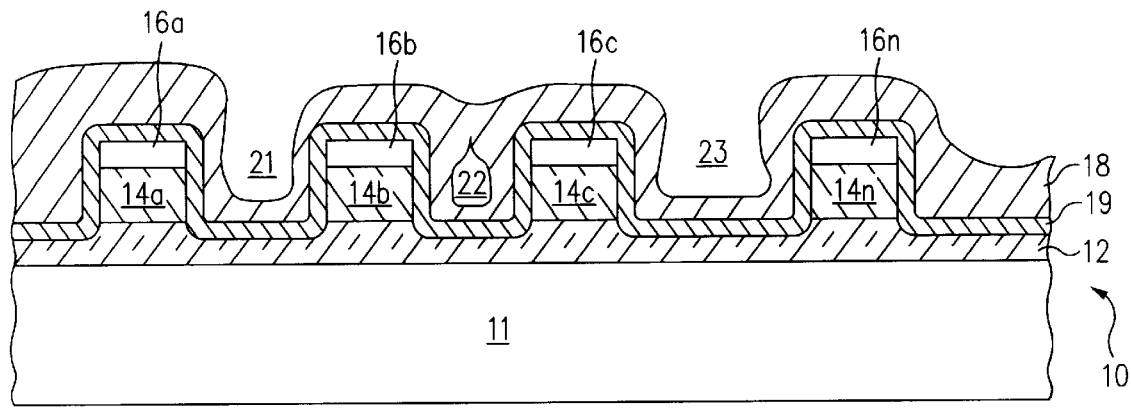
FIG. 1F illustrates the appearance of the structure of 1E after a plasma etchback operation.
Figure 1G:
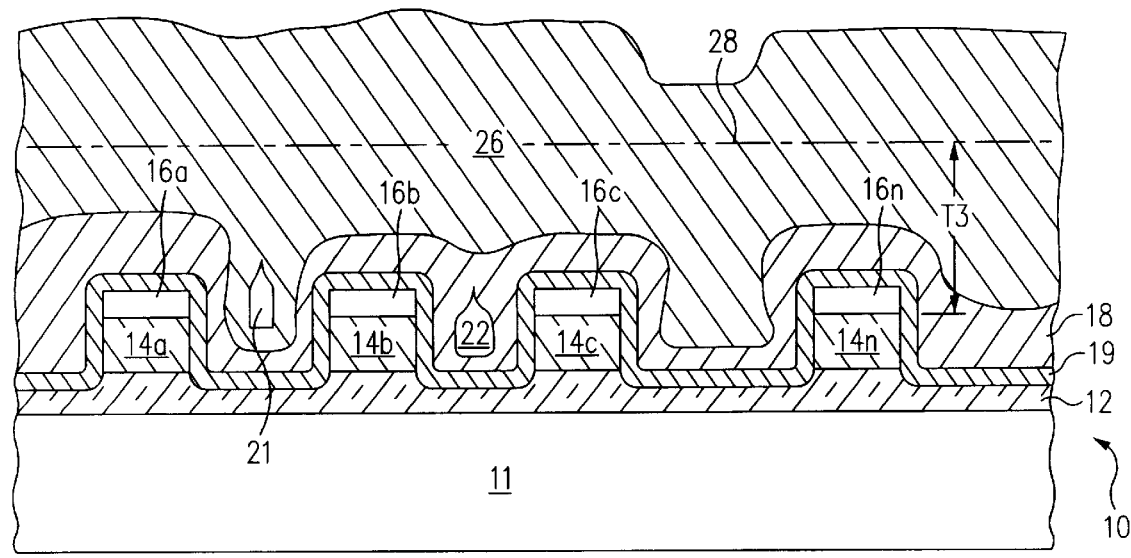
FIG. 1G illustrates the structure of FIG. 1F after application thereto of a second layer of dielectric material.

Although the embodiment of FIG. 1D shows the presence of capping members 16a–16n, as do the embodiments of FIGS. 1E–1G, it will be understood that the invention may be employed in the same manner if the effective thickness of the conductor members is increased by an increase in metal thickness as in the embodiment of FIG. 1A.

In summary, the present invention proposes three methods to increase the aspect ratio of the conductor members to increase the available volume between conductor members for the formation of low dielectric constant air gaps therebetween: an increase in the conductor member thickness, the addition of a dielectric capping member on each conductor member, the overetching of the dielectric layer under the conductor members, or a combination of any of these three methods.

FIG. 1E illustrates the use of a poor step coverage dielectric layer 18 which may be applied over the conductor members and dielectric capping layer structures as shown in FIGS. 1A, 1C and 1D. Conductor members 14a–14n are shown covered by a dielectric capping members 16a–16n as described above in connection with FIG. 1C, with underlying dielectric layer 12 overetched as described above in connection with FIG. 1D. Prior to applying poor step coverage layer 18, a thin conformal coating 19 such as TEOS may be applied over the structure as mentioned above. The purpose of this conformal coating is to insure the electrical isolation of adjacent conductor members. It has been found that some conductor members may have sidewall protrusion which could contact an adjacent conductor member and produce shorting, and conformal coating 19 prevents this conductor migration. Conformal coating 19, if used, may have a thickness of between 0.05 and 0.20 microns.

Coating with poor step coverage layer 18 results in the formation of air gaps such as an air gap 21 between adjacent conductors 14a, 14b in FIG. 1E and an air gap 22 between conductors 14b and 14c, with air gap 21 being located higher in coating 18 than air gap 22. Such air gaps generally have a tear-drop shape, with a narrowing of the top as shown, when formed between closely spaced conductor members such as conductor members 14a and 14b and between conductor members 14b and 14c. Between more widely spaced conductor members, such as conductor members 14c and 14n, the air gap is usually in the form of an open space 23.

The material utilized for poor step coverage layer 18 is preferably a silane-based oxide, since such materials produce poorer step coverage than TEOS materials. In general, TEOS materials produce better conformity in the coatings than do silane-based materials. If conformity is defined as the ratio between the thickness of the thinnest portion of the oxide coating to the thickness of the thickest portion of the oxide coating, TEOS oxide coatings generally have a ratio in excess of 60%, while silane-based oxides for the same maximum thickness have ratios less than 50%. The silane-based oxides produce a so-called "bread loaf" profile, with the minimum thickness near the sides of the conductor members, and it is this profile which is utilized in the present invention to increase the available volume between conductors for a low dielectric constant material.

In FIG. 1F, the effect of a plasma etchback technique and different spacings between the conductor members on air gap formation are illustrated. In accordance with the present invention, plasma etching is not intended to affect air gaps such as air gap 22 between closely spaced conductor members such as members 14b, 14c. The plasma etchback is directed to open up and reshape intermediate spacings such as air gap 21 between conductor members 14a and 14b.

The opening of air gap 21 reshapes air gap 21 to extend further downward toward substrate 11 and between conductors 14a, 14b, thereby reducing the capacitance between conductors 14a, 14b. As a general rule, between conductor members having aspect ratios of about 2, such as conductors 14b and 14c, air gap 22 will remain closed, while between conductors 14a and 14b, which have an aspect ratio of about 1.5 or less, air gap 21 is opened and made deeper by the plasma etchback as shown in FIG. 1F.

The plasma etchback operation is performed using a process employing little or no polymer. The etchant material used for plasma etchback in the present invention may be any material commonly employed to etch silicon dioxide, such as different fluorine compounds. In many etching operations, polymer etching materials are utilized to produce an anisotropic etching, in which the polymer material is re-deposited on the sidewalls of the material being etched to prevent undesired further etching of the sidewalls. In the present invention, such an anisotropic etching is desirable, but the resultant polymer residue is undesirable because of its tendency to enter the air gaps and other openings in dielectric coating 18. The presence of any significant amount of such polymer residue in the air gaps or other openings after plasma etchback will require a subsequent cleaning operation to remove this debris. Thus, the plasma etchback operation of the present invention preferably employs very little or no polymer etching material.

However, if a low-polymer-containing material is used in the etchback, the structure may be treated by a dry cleaning operation such as an oxygen plasma ashing operation to remove any residual polymer material. A wet cleaning operation is preferably avoided because of the likelihood of entrapping some of the cleaning liquid in the air gaps or tunnels formed in the dielectric layer. However, in an alternative embodiment, a wet cleaning operation may be performed.

A second layer 26 of dielectric material is then applied to the structure of FIG. 1F to produce a structure as shown in FIG. 1G. Layer 26 may be of any suitable dielectric material such as a TEOS or a silane-based oxide, and is initially applied to a considerable thickness of about 2 microns or more. Layer 26 will form around open air gaps 21, thus preserving air gaps such as air gap 21 as volumes in the spaces between the conductor having a low dielectric constant. Air gap 22 will remain sealed by dielectric layer 18 to preserve such air gaps as low dielectric constant volumes.

In applying layer 26, air gap 23 is filled by layer 26. However, this is not a significant factor since there is little capacitance between conductor members 14c and 14n due to the relatively large size of the spacing between conductor members 14c and 14n.

Next, a portion of layer 26 is removed by photoresist techniques or through the use of chemical mechanical polishing (CMP) to produce a resultant planarized coating at surface 28 of the desired thickness for subsequent additional metalization layers if desired. Preferably, the final thickness T3 of layer 26 above the tops of conductor members 14a–14n is on the order of 1.0 micron.

While the present invention has been particularly described in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. In an integrated circuit structure of the type that includes an insulating layer, a conductor layer formed on top of said insulating layer, and a plurality of spaced electrical conductor members formed from said conductor layer, a method for decreasing the dielectric constant between said conductor members comprising the steps of:

increasing the vertical thickness of said conductor members to thereby increase the volume between said members;

depositing a first dielectric film on said conductor members, said dielectric film being a film of poor step coverage to thereby produce air gaps in said first dielectric film between said conductor members;

etching said first dielectric film to remove portions thereof and thereby open up at least some of said air gaps and extend said air gaps further downward between said conductor members; and depositing a second dielectric film on said first dielectric to seal said air gaps.

2. A method in accordance with claim 1 including the steps of depositing a nonconductive capping layer on said conductor layer prior to forming the electrical conductor members therein; and etching said capping layer and said conductor layer to form a plurality of spaced conductor members, each having a portion of said capping layer thereon.

3. A method in accordance with claim 1 including the step of:

overetching said insulating layer to a depth of about 0.3 microns after forming said conductor members to thereby increase the volume between said conductor members.

4. A method in accordance with claim 1 in which the increase in the vertical thickness of said conductor members is achieved by increasing the thickness of the material in said conductor layer.

5. A method in accordance with claim 1 including the steps of:

forming a capping layer of dielectric material on said conductor members prior to deposition of said first dielectric film; and etching said insulating layer to a depth of about 0.3 microns after forming said conductor members to thereby increase the volume between said conductor members.

6. A method in accordance with claim 1 including the step of depositing a thin conformal coating over the entire exposed surface of said conductor members prior to deposition of said first dielectric film to prevent electrical shorting between adjacent ones of said conductor members.

7. A method for decreasing the dielectric constant between spaced conductor members formed on an insulating layer in an integrated circuit structure comprising the steps of:

depositing a first dielectric film on said conductor members, said first dielectric film producing poor step coverage of said conductor members to thereby produce air gaps in said first dielectric film between said conductor members;

etching said first dielectric film to remove portions of said film and to change the shape of at least some of said air gaps; and depositing a second dielectric film on said first dielectric film after said etching to seal at least some of said air gaps.

8. A method in accordance with claim 7 in which said etching of said first dielectric film is performed using a low polymer etch.

9. A method in accordance with claim 8 including the step of dry post-etch cleaning said first dielectric film.

10. A method in accordance with claim 8 including the step of wet post-etch cleaning of said first dielectric film.

11. A method in accordance with claim 7 in which said etching of said first dielectric film opens some of said air gaps in said first dielectric film.

12. A method in accordance with claim 7 including the step of polishing said second dielectric film after deposition to produce a planar surface thereon.

13. A method in accordance with claim 7 including the step of depositing a conformal coating on said conductor members prior to deposition of said first dielectric film.

14. A method in accordance with claim 5, further comprising the step of:

etching said capping layer to form a cap of a dielectric material on top of each of said conductor members, each said cap having vertical sidewalls aligned with vertical sidewalls of a corresponding one of said conductor members.

* * * * *